(12) United States Patent
Yoshida et al.

(10) Patent No.: US 6,621,003 B2
(45) Date of Patent: Sep. 16, 2003

(54) ELECTROMAGNETIC RADIATION SHIELDING MATERIAL, A METHOD OF PRODUCING THE SAME AND A DISPLAY DEVICE USING THE SAME

(75) Inventors: Hiroshi Yoshida, Chiba (JP); Shin Kuwabara, Chiba (JP); Koji Banno, Chiba (JP)

(73) Assignee: Nisshinbo Industries, Inc., Chuo-ku (JP)

( * ) Notice: Subject to any disclaimer, the term of this patent is extended or adjusted under 35 U.S.C. 154(b) by 0 days.

(21) Appl. No.: 10/126,550

(22) Filed: Apr. 22, 2002

(65) Prior Publication Data

US 2002/0180324 A1 Dec. 5, 2002

(30) Foreign Application Priority Data

Apr. 27, 2001 (JP) ........................................ 2001-131554

(51) Int. Cl.[7] ................................................ H05K 9/00
(52) U.S. Cl. ................................ 174/35 MS; 174/35 R; 428/432; 442/18
(58) Field of Search ..................... 174/35 R; 428/203, 428/204, 209, 210, 221, 426, 432, 433; 442/6, 18, 19

(56) References Cited

U.S. PATENT DOCUMENTS

| | | | | | |
|---|---|---|---|---|---|
| 4,678,699 | A | * | 7/1987 | Kritchevsky et al. | 428/175 |
| 4,826,718 | A | * | 5/1989 | Unsworth et al. | 428/175 |
| 6,090,473 | A | * | 7/2000 | Yoshikawa et al. | 428/209 |
| 6,452,331 | B1 | * | 9/2002 | Sakurada et al. | 313/582 |

FOREIGN PATENT DOCUMENTS

| JP | 05283889 A | * 10/1993 | ............ H05K/9/00 |
|---|---|---|---|

* cited by examiner

*Primary Examiner*—Dean A. Reichard
*Assistant Examiner*—Carmelo Oliva
(74) *Attorney, Agent, or Firm*—Smith Patent Office (57) ABSTRACT

A transparent electromagnetic radiation shielding sheet having sufficient visible light transmittance and electromagnetic radiation shielding performance is disclosed. The transparent electromagnetic radiation shielding sheet includes a hot melt adhesive resin comprising a resin having a structure where organic acid is not produced by hydrolysis. The transparent electromagnetic radiation shielding sheet is light, excellent in durability and is favorably used in various display devices. A method of producing the transparent electromagnetic radiation shielding sheet and a display device such as a plasma display device and a CRT (cold-cathode ray tube) having the transparent electromagnetic radiation shielding sheet placed on the front surface of a display panel of the display device are also disclosed.

17 Claims, 5 Drawing Sheets

ELECTROMAGNETIC RADIATION SHIELDING MATERIAL, A METHOD OF PRODUCING THE SAME AND A DISPLAY DEVICE USING THE SAME

BACKGROUND OF THE INVENTION

1. Field of the Invention

The present invention relates to a transparent electromagnetic radiation shielding sheet, a method of producing the same and a display device using the same. More particularly, the present invention relates to a transparent electromagnetic radiation shielding sheet that has sufficient visible light transmittance and electromagnetic radiation shielding performance and that is also light, excellent in durability and is favorably used in various display devices. Further, the present invention relates to a method of producing such transparent electromagnetic radiation shielding sheet. Furthermore, it relates to a display device such as a plasma display device and a CRT (cold-cathode ray tube) having the transparent electromagnetic radiation shielding sheet placed on the front surface of a display panel of the display device.

2. Discussion of the Related Art

It has been noted that electromagnetic radiation is generated from the surface of a display panel of a plasma display device, a CRT device, etc. In recent years, the interference with other devices and the influence of the electromagnetic radiation on human health caused by this electromagnetic radiation has become an issue.

To shield such electromagnetic radiation, a transparent electromagnetic radiation shielding sheet has been widely used for attachment to or placement on the front surface of a display panel. Examples of such transparent electromagnetic radiation shielding sheets include ones that are produced by a method such as (1) laminating a transparent conductive film having indium oxide, tin oxide, silver, etc. on a plastic transparent base material (International Patent Publication No. 98/13850), (2) integrally laminating a synthetic fiber fabric such as polyester having a copper/nickel thin film layer which is coated on the surface thereof on a transparent base material (Japanese Patent Application Laid-Open No. 8-183132 (JP 8-183132), (3) integrating a synthetic fiber fabric such as polyester having a copper/nickel thin film layer coated on the surface thereof to be intervened between two sheets of glass plate (JP 11-74684), (4) laminating a mesh-like conductive material and a glass or plastic transparent base material with a hot melt adhesive resin therebetween (JP 2001-77587) and (5) patterning a conductive mesh on a glass or plastic transparent base material (JP 5-283889).

However, the above-mentioned conventional techniques have the following problems, respectively:

(1) With this structure in which the transparent conductive film is laminated on the transparent base material, it is difficult to satisfy both visible light transmittance and electromagnetic radiation shielding performance. Also, when this transparent electromagnetic radiation shielding sheet is used in a plasma display device which emits a particularly strong electromagnetic radiation, sufficient electromagnetic radiation shielding performance cannot be obtained. (2) With this structure in which the conductive fabric is laminated on the transparent base material, the fabric tends to gather particles and dust thereby the visibility is degraded. (3) With this structure in which the conductive fabric is intervened between the two sheets of glass plate to integrally laminate the component materials, an attempt to make the obtained sheet light cannot be achieved because two sheets of glass plate are used therein.

Regarding the structures (4) and (5) above, sufficient visible light transmittance and electromagnetic radiation shielding performance may be obtained by controlling the line widths and line intervals of the conductive mesh or the conductive pattern. It may also be possible to obtain a transparent electromagnetic radiation shielding sheet that is relatively light and has various functions by laminating a glass or plastic transparent base material and various polymeric function film having a function such as antireflection, antiglare, near infrared ray absorption, etc. However, when these transparent electromagnetic radiation shielding sheets are placed under the condition with high temperature and high moisture for a long period of time, the conductive mesh or the conductive pattern of the metal corrodes. As a result, the visibility of the transparent electromagnetic radiation shielding sheet is degraded.

SUMMARY OF THE INVENTION

It is an object of the present invention to provide a transparent electromagnetic radiation shielding sheet that has both sufficient visible light transmittance and electromagnetic radiation shielding performance and that is also light, excellent in durability and is favorably used in various display devices.

It is another object of the present invention to provide a method of producing such transparent electromagnetic radiation shielding sheet.

It is a further object of the present invention to provide a display device such as a plasma display device and a CRT (cold-cathode ray tube) having the transparent electromagnetic radiation shielding sheet which is placed on the front surface of the display panel thereof.

In their attempts to achieve these objects, the inventors learned that hot melt adhesive resins such as ethylene-vinylacetates and polyesters are generally used for a transparent electromagnetic radiation shielding sheet because they have excellent forming ability, visible light transmittance and adhesiveness to glass and plastics. They also learned that when these hot melt adhesive resins are placed under conditions of high temperature and high moisture for a long period of time, organic acid is produced by hydrolysis, and the conductive mesh or the conductive pattern having a metal corrodes. In addition, the ionized metals of the conductive mesh or the conductive pattern form complexes that exhibit color. As a result, the visibility of the transparent electromagnetic radiation shielding sheet is degraded.

Through their further studies, the inventors have found that a transparent electromagnetic radiation shielding sheet having excellent performance and capabilities as discussed above can be obtained by using a hot melt adhesive resin comprising a resin having a structure where organic acid is not produced by hydrolysis. The present invention has been accomplished based on these findings.

Specifically, the present invention provides:

(1) A transparent electromagnetic radiation shielding sheet comprising:
  a transparent base material,
  a mesh-like conductive material having a metal, and
  a resin layer contacting at least one surface of said mesh-like conductive material,
  wherein said resin layer comprises a hot melt adhesive resin having more than 80 weight % of at least one of the repetition units represented by the following generic formulae (I), (II) and (III):

$$—(—CH_2—CH(R^1)—)—\qquad(I)$$

(wherein $R^1$ represents a hydrogen atom or a methyl group)

$$—(—CH_2—C(R^2)(COO—R^3)—)—\qquad(II)$$

(wherein $R^2$ represents a hydrogen atom or a methyl group, and $R^3$ represents an alkyl group having from 1 to 4 carbon atoms)

(III)

(wherein $R^4$ represents a hydrogen atom or an alkyl group having from 1 to 4 carbon atoms);

(2) a method of producing a transparent electromagnetic radiation shielding sheet in which a mesh-like conductive material having a metal and a hot melt adhesive film having more than 80 weight % of at least one of the repetition units represented by the generic formulae (I), (II) and (III) are laminated on a transparent base material by thermal pressing so that the hot melt adhesive film is melted thereby the component materials are integrally laminated; and (3) a display device having the transparent electromagnetic radiation shielding sheet which is placed on the front surface of the display panel thereof.

BRIEF DESCRIPTION OF DRAWINGS

The above and other objects and features of the present invention will be clearly understood from the following description with respect to the preferred embodiment thereof when considered in conjunction with the accompanying drawings, in which.

DETAILED DESCRIPTION OF THE PREFERRED EMBODIMENTS

The transparent electromagnetic radiation shielding sheet of the present invention comprises a transparent base material, a mesh-like conductive material having a metal and a hot melt adhesive resin layer contacting with at least one surface of the mesh-like conductive material.

Figure 1:
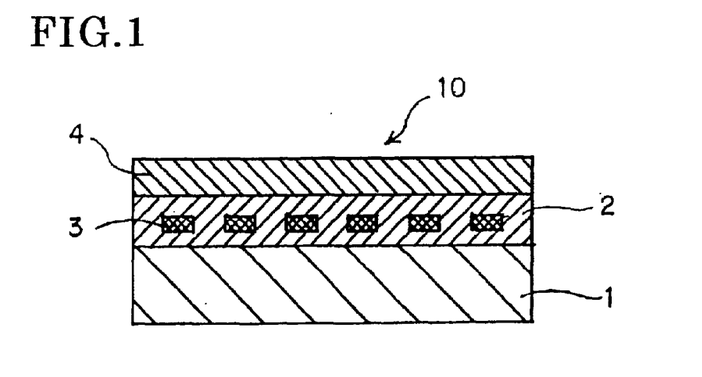
FIG. 1 shows a cross sectional view of an embodiment of a transparent electromagnetic radiation shielding sheet according to the present invention.
Figure 2:
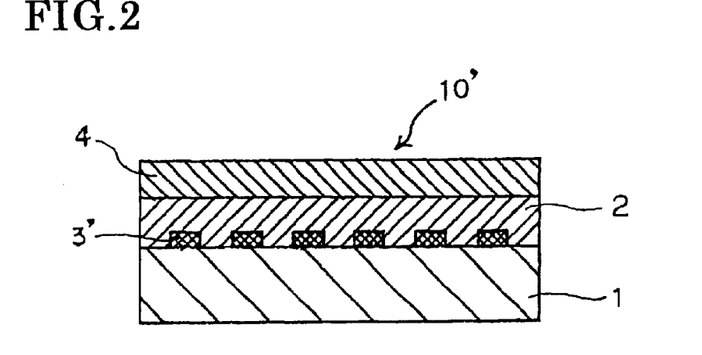
FIG. 2 shows a cross sectional view of another embodiment of a transparent electromagnetic radiation shielding sheet according to the present invention.

FIGS. 1 and 2 show cross sectional views of different embodiments of the transparent electromagnetic radiation shielding sheet of the present invention. As shown in FIG. 1, a transparent electromagnetic radiation shielding sheet 10 has a laminated structure in which a hot melt adhesive resin layer 2 having a mesh-like conductive material 3 which is integrally buried therein is formed on a surface of a transparent base material 1, and also a polymer function film 4 is formed thereon. As shown in FIG. 2, a transparent electromagnetic radiation shielding sheet 10' has another laminated structure in which a mesh-like conductive pattern 3' is formed on one surface of a transparent base material 1, and also a polymer function film 4 is formed thereon with a hot melt adhesive resin layer 2 being intervened therebetween.

Here, the phrase "integrally buried therein" covers not only a structure in which the mesh-like conductive material 3 is completely buried in the hot melt adhesive resin layer 2, but also a structure in which the mesh-like conductive material 3 is buried in the hot melt adhesive resin layer with a portion of the mesh-like conductive material 3 being exposed on the surface of the resin layer 2 so the exposed surface of the mesh-like conductive material shares the same surface as that of the resin layer 2.

The hot melt adhesive resin used in the present invention may possibly be used in the following two cases: (a) When adhering the mesh-like conductive material to the transparent base material, it is applied to at least one surface of the mesh-like conductive material; and (b) when adhering other component materials. The present invention has a specific feature with respect to the combination of the mesh-like conductive material and the hot melt adhesive resin. While usable hot melt adhesive resins used in (a) above are specified as discussed below, ones used in (b) are not particularly limited. Therefore, the same hot melt adhesive resin may be used in (a) and (b), or different hot melt adhesive resins may also be used.

Usable hot melt adhesive resins used in (b), which do not have any contact with the mesh-like conductive material, are not particularly limited as long as they have high adhesiveness to glass and a polymer film as well as high visible light transmittance after being heated and adhered. Examples of such a hot melt adhesive resin include polyolefin, acrylic, polyamide and butylrubber types of hot melt adhesive resin. Among these, polyolefin and acrylic types of hot melt adhesive resins are particularly preferable in view of their high visible light transmittance after thermal adhering.

For the hot melt adhesive resin of the transparent electromagnetic radiation shielding sheet of the present invention for use as in (a), ones having more than 80 weight %, preferably more than 90 weight %, more preferably more than 95 weight %, of at least one of the repetition units represented by the following generic formulae (I), (II) and (III):

(wherein $R^1$ represents a hydrogen atom or a methyl group)

(wherein $R^2$ represents a hydrogen atom or a methyl group, and $R^3$ represents an alkyl group having from 1 to 4 carbon atoms)

(wherein $R^4$ represents a hydrogen atom or an alkyl group having from 1 to 4 carbon atoms) are used.

Usable hot melt adhesive resins for such use are not particularly limited as long as they are resins that comprise at least one of the repetition units in the ratio as specified above. It may be a homopolymer, copolymer, denatured products thereof, or a mixture of two or more of these polymers. Examples of usable hot melt adhesive resin include polyethylene, polypropylene, polyethylene-polypropylene copolymer, resins treated by denaturation such as oxidization, polyvinylacetal, polyvinylbutyral, ethylene-ester(meth)acrylate copolymer. These resins may be used individually or in a combination of two or more thereof.

The hot melt adhesive resin used in the present invention preferably has the Vicat softening temperature of preferably 70–120° C. which is measured in conformance with JIS K6760 in order to reduce the heat effect on the polymeric function film having a function such as antireflection, antiglare and near infrared ray absorption when integrally laminating the hot melt adhesive resin with the polymeric function film and also to improve the durability of the transparent electromagnetic radiation shielding sheet.

Examples of the mesh-like conductive material used in the present invention include metallic mesh materials having a metal such as a copper, a stainless steel, materials given a metal plating such as a nickel plating and a chromium plating on the surface of the metallic mesh materials, materials given a metal plating such as a copper plating and a nickel plating on the surface of a synthetic fiber fabric such as polyester, materials having a mesh-like conductive pattern formed on a glass or plastic transparent base material by etching. Among these, an etched copper foil and a patterned copper that is formed on the base material by etching are particularly preferable in view of high electromagnetic radiation shielding performance and visible light transmittance. There is no limit as to surface treatments such as applying a conductive paint, coating with a resin, plating, treating with acid, etc.

The etched copper foil and the conductive mesh-patterned glass plate having a conductive mesh pattern formed on the base material as mentioned above can be produced by, for example, a method as described below:

For obtaining the etched copper foil having a desired mesh-like conductive material, a method comprising the steps of laminating a dry film resist on both surfaces of a copper foil on which blackening treatment is applied; exposing and developing the copper foil using a photo mask which has the same pattern as the desired mesh-like pattern formed on one surface of the copper foil; etching the copper foil to form the desired mesh-like pattern on a base film (such as a PET film) using ferric chloride aqueous solution; rinsing the copper foil with water and drying it; peeling off the dry film resist in resist peeling solution (such as sodium hydroxide aqueous solution); and washing and drying the copper foil, is used.

Also, for obtaining the glass plate having a desired conductive mesh pattern, a method comprising the steps of forming a negative type of resist layer on the entire surface of a glass plate; exposing and developing the resist layer using a photo mask having the same pattern as a desired mesh-like pattern; washing and drying the obtained glass plate so as to form a resist layer having a pattern opposite to the desired mesh-like pattern; forming a metallic thin film layer and a black layer by laminating copper oxide (transparent)/copper/copper oxide (black) in this order on the entire surface of the obtained resist layer by scattering; removing the resist layer as well as the metallic layer and the black layer formed thereon using peeling solution (such as 4 weight % of sodium hydroxide aqueous solution); and washing the glass plate with purified water (Japanese Patent Application No. 2000-377501) is used.

The line diameter (line width) of the mesh-like conductive material is preferably in the range of 5–60 μm, more preferably in the range of 10–30 μm. The line interval (line pitch) is preferably in the range of 150–400 μm, more preferably in the range of 180–300 μm. A line width exceeding 60 μm and a line pitch of less than 150 μm are not preferable because the visibility is degraded. A line width of less than 5 μm and a line pitch exceeding 400 μm are not also preferable because the line interval becomes too wide so that the electromagnetic radiation shielding performance is degraded. The thickness of the mesh-like conductive material is preferably in the range of 0.1–100 μm, more preferably in the range of 0.5–35 μm.

In the present invention, the mesh-like conductive material preferably has a structure in which a portion of the mesh-like conductive material is externally exposed from the edge portions of the transparent electromagnetic radiation shielding sheet so as to ensure to provide the ground. By ensuring the ground provided from the exposed portions, the electromagnetic radiation can be shielded more efficiently. In addition, because the ground is ensured, insufficient connection to the ground caused by the movement of earth leads can be avoided thereby the electromagnetic radiation shielding performance with long-term stability can be achieved. Particularly, the mesh-like conductive material has a structure in which the mesh-like conductive material is preferably exposed on at least one of the peripheral sides, most preferably, on all of the peripheral sides thereof with the exposed area facing externally on the surface of the transparent base material. The exposed areas may face up to either the visible side or the non-visible side.

For the transparent base material of the transparent electromagnetic radiation shielding sheet of the present invention, a glass substrate or a transparent plastic base material is preferably used. Usable glass substrates are not particularly limited. Examples of the usable glass substrate include a glass plate such as soda glass, semi-tempered glass and tempered glass. Also, usable transparent plastic base materials are not particularly limited. Examples of the usable transparent plastic base material include film, sheet and plate types of plastic material such as acrylic resins, polycarbonate, polystyrene, methyl-styrene methacrylate copolymer. The size (area) of this transparent base material can be determined depending on, for example, the size of the screen of a display being used; however, it is preferable to use semi-glass and tempered glass for a large display size for safety purposes.

The thickness of these transparent base materials is not particularly limited; however, it is preferably selected from the range of 0.1–10 mm, more preferably from the range of 2–5 mm. With a thickness of less than 0.1 mm, the strength of the material may be insufficient whereas a thickness exceeding 10 mm is not also preferable because it becomes difficult to make the product light.

In the transparent electromagnetic radiation shielding sheet of the present invention, a polymeric function film having a function layer that selectively transmits wavelengths of light, such as an antireflection layer, an antiglare layer and a near infrared ray absorbing layer formed thereon, can be also laminated. Such polymeric function film may be formed on the surface of one side of the transparent electromagnetic radiation shielding sheet on which the mesh-like conductive material is formed. It may also be formed on the surface of the other side of the transparent electromagnetic radiation shielding sheet. Or, it may be formed to integrally intervene between the component layers of the transparent electromagnetic radiation shielding sheet. In particular, it is preferable to laminate one of or two or more of these function films when used for placement at the front of a CRT (cold-cathode ray tube), a plasma display, etc. The polymeric function film is not particularly limited and can be colored or non-colored as long as it is a synthetic resin film having transparency. Usable synthetic resins include polyester, acrylic resin, polycarbonate, polystyrene, polyamide, polyvinylchloride, ABS, polyethylene, polypropylene, triacetylcellulose, cellulose acetate butylate and cellulose propionate. The thickness of the polymeric function film is not particularly limited; however, it is normally in the range of about 50–1,000 $\mu$m.

For the polymeric function film used for a front sheet of a PDP, one that is designed for optical use and also comprises at least one function selected from the group consisting of near infrared ray shielding, antiglare and color adjusting functions is particularly preferred. A polymeric function film having these functions may be a sheet of film having a plurality of these functions or a laminated film comprising a plurality of films having one of these functions. Also, it may be placed on both surfaces of a transparent base material. The number of films used in the polymeric function film is not particularly limited. Which function to be included in the polymeric function film is appropriately determined depending on how the transparent electromagnetic radiation shielding sheet is used.

Examples of the polymeric function film having a near infrared ray shielding function include: a film comprising a thin film formed on a transparent base film by means of deposition of a near infrared reflection substance such as silver, a near infrared ray absorbing coloring agent, a near infrared ray absorbing substance such as metallic oxide; a film having the near infrared ray absorbing coloring agent and/or the metallic oxide dispersed in a transparent resin by means of kneading-in, etc.; and a film obtained by a method comprising the steps of mixing the near infrared ray absorbing coloring agent and/or the metallic oxide in resin solution which is prepared by dissolving a resin into solvent, uniformly dispersing the resin solution, coating the resin on a transparent base film by means of casting, etc., and removing the solvent so as to form a near infrared ray absorbing layer. Usable polymeric function film is not particularly limited as long as it is a film having a near infrared ray shielding function.

Examples of the above-mentioned near infrared ray absorbing coloring agent include phtalocyanine, naphtalocyanine, diimmonium, dithiol metal complex, azo compound, polymethine and anthraquinone types of coloring agent.

Also, examples of the above-mentioned metallic oxide include tin-doped indium oxide (ITO) and antimony-doped tin oxide (ATO).

In the transparent electromagnetic radiation shielding sheet having a polymeric function film which is provided with near infrared ray shielding function by the means as mentioned above, the transmittance of all of the lights in the visible band area of a transparent base material is preferably more than 45%, and the transmittance of the light having 800–1,100 nm of wavelength is preferably less than 30%. By setting the light transmittance within these ranges, the transparency of a transparent electromagnetic radiation shielding sheet can sufficiently be ensured, and also the faulty operation of a remote controller can be prevented. Here, the words "in the visible band area" mean the range from 450 to 650 nm of wavelength.

Means for providing the polymeric function film with an antireflection function and/or an antiglare function is not particularly limited and therefore well-known means can be used. The position where these functions are provided in the polymeric function film is not particularly limited; however, it is preferable that they are provided on the surface of a base film such as a polyester film and a triacetylcellulose film because the antireflection function and the antiglare function can more effectively be exhibited. (A film given an antireflection function may be called an AR (Anti Reflection) film, and a film given an antiglare function may be called an AG (Anti Glare) film.)

Figure 3:
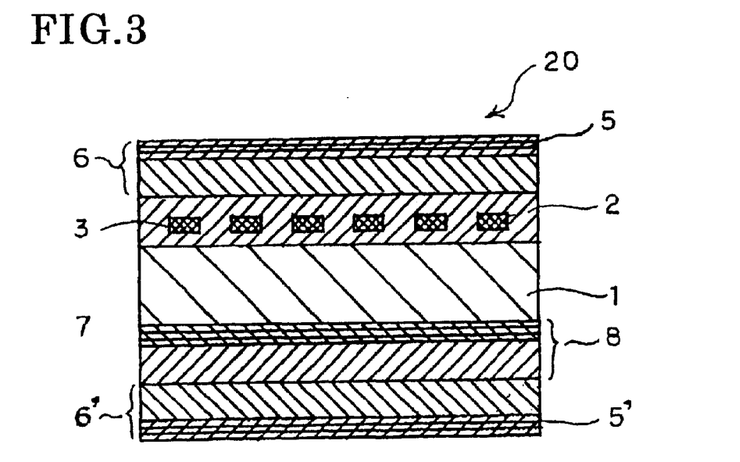
FIG. 3 shows a cross sectional view of an embodiment of a transparent electromagnetic radiation shielding sheet according to the present invention designed for use in a plasma display.

FIG. 3 shows a cross sectional view of an embodiment of the transparent electromagnetic radiation shielding sheet of the present invention used for a plasma display. This transparent electromagnetic radiation shielding sheet 20 has a structure in which a hot melt adhesive resin layer 2 having a mesh-like conductive material 3 that is integrally buried in the hot melt adhesive resin layer and a polymeric film 6 having an antireflection layer 5 formed thereon are subsequently laminated on one surface of a transparent base material 1. Further, a polymeric film 8 having a near infrared ray absorbing layer 7 formed thereon and a polymeric film 6' having an antireflection layer 5' formed thereon are formed in the order on the other surface of the transparent base material 1. In this figure, adhesive layers between the transparent base material 1 and the plastic film 8 as well as between the plastic film 8 and the plastic film 6' are not shown.

The transparent electromagnetic radiation shielding sheet of the present invention having such structure can efficiently be produced by the method as described below.

In the method of the present invention, a mesh-like conductive layer and a film having the above-described hot melt adhesive resin (hot melt adhesive film) are laminated on a transparent base material. Then, thermal pressing is carried out so as the hot melt adhesive film to melt thereby the component materials are integrally laminated to provide a transparent electromagnetic radiation shielding sheet. The order of laminating the mesh-like conductive material and the hot melt adhesive film on the transparent base material is not particularly limited. For example, the mesh-like conductive material may be laminated on the transparent base material with the hot melt adhesive film intervened therebetween and then thermal pressing is carried out. Also, the hot melt adhesive film, the mesh-like conductive material and the hot melt adhesive film may be laminated in order on the transparent base material and then thermal pressing is carried out. It is also possible that the mesh-like conductive material and the hot melt adhesive film are laminated in order on the transparent base material and then thermal pressing is carried out.

Figure 4:
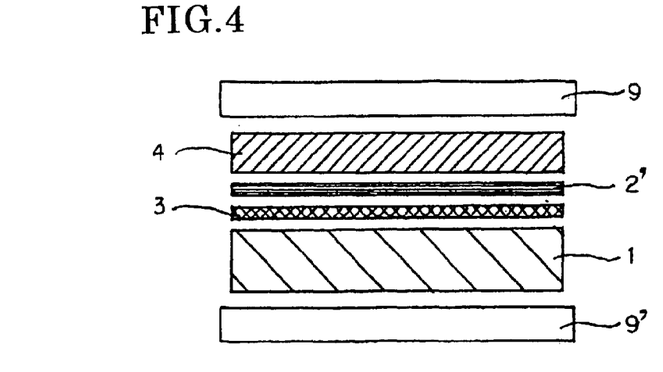
FIG. 4 is a drawing for explaining a method of producing a transparent electromagnetic radiation shielding sheet according to the present invention.

FIG. 4 shows a drawing for explaining an embodiment of the method of producing the transparent electromagnetic radiation shielding sheet according to the present invention. A mesh-like conductive material 3 is formed on a transparent base material 1, and a hot melt adhesive film 2' and a polymeric function film 4, if necessary, are laminated thereon. Then, the laminated sheet is sandwiched and pressed between a pair of pressing plates 9, 9' under the heat being applied so as to integrally laminate the laminated sheet. Thereby, a transparent electromagnetic radiation shielding sheet is obtained. By heating, the hot melt adhesive film 2' is melted so as to adhere to the transparent base material 1. Also, when the surface of the transparent base material is uneven, the molten resin is permeated into the uneven portion of the transparent base material so that the component materials can be integrally laminated without remaining any gap between the base material and the hot melt adhesive resin layer. As a result, it is possible to provide a transparent electromagnetic radiation shielding sheet with excellent visibility.

The device for thermal pressing in the method of the present invention is not particularly limited as long as it is capable of heating while sandwiching and pressing a laminated sheet. Usable devices for thermal pressing include a heat press, a roll laminator, a planar plate laminator, etc. To prevent remaining bubbles in the laminated sheet, a method in which a laminated sheet is disposed in a bag and then thermal pressing is conducted under decompression, or a method in which a laminated sheet is thermal pressed is conducted as each press chamber or each laminate chamber is decompressed is preferably used.

The heating temperature and the pressure being applied in this thermal pressing step are appropriately determined depending on, for example, the capabilities of materials being used; however, the heating temperature is preferably 80–150° C., more preferably 100–130° C. The pressure being applied is preferably 0.05–6 MPa, more preferably 0.1–2 MPa. The surfaces facing one another of the pressing plates are preferably panel surfaces. In this way, a transparent electromagnetic radiation shielding sheet having an excellent flatness on the surface can be obtained.

The thickness of the hot melt adhesive film in the method of the present invention is preferably 10–200 $\mu$m and also preferably thicker than that of the mesh-like conductive layer by more than 10 $\mu$m. The hot melt adhesive films used herein are normally thermal plastic resins so that the films can be produced by a means of extrusion of plastic, etc. In addition, it becomes easy to form bypasses for air on the surface of such film by embossing at the time of the thermal pressing.

When using the structure in which a portion of the mesh-like conductive material is externally exposed from the edge portions of the transparent electromagnetic radiation shielding sheet to ensure providing the ground as discussed above, such a structure can be easily obtained by appropriately adjusting the size of the component materials such as the transparent base material, the hot melt adhesive film and the mesh-like conductive material to be placed between the pair of pressing plates and the position to laminate the component materials at the time of thermal pressing. For example, the size of the hot melt adhesive film may be adjusted so as to be smaller than that of the mesh-like conductive material. In such way, the sizes of the transparent base material and the mesh-like conductive material may be the same, or either one may be larger than the other. Also, the size of the hot melt adhesive film is preferably determined in consideration of the area for the ground and stretching of the hot melt adhesive film at thermal pressing.

In an embodiment of the present invention, a hot melt adhesive film that is formed as in the form of film is used; however, pressure-sensitive adhesives and other thermosensitive adhesives can also be used as long as they do not degrade the capabilities and the effects of the present invention. For example, by forming a pressure-sensitive adhesive layer on the inner surface of the polymeric function film, a hot melt adhesive film and a frame member can be preset (can be temporarily fixed) on the inner surface of the polymeric function film so that the accuracy of positioning the materials is improved. Further, a laminating step can be simplified. Furthermore, for a sheet used for placement at the front of a PDP in which many sheets of materials are laminated, a pressure-sensitive adhesive layer is formed on the surface of appropriate materials so that the hot melt adhesive film can be preset. In this way, the number of sheets of the laminated materials in the laminating step can be reduced. At the same time, the accuracy of positioning at laminating can be increased thereby the efficiency in laminating can be improved.

When using a pressure-sensitive adhesive together with the hot melt adhesive film, well-known pressure-sensitive adhesives, which have sensitivity to pressure, can be used. Such a pressure-sensitive adhesive normally is a semi-solid (high viscosity) liquid, exhibits stickiness at a room temperature and has a capability of adhering by pressure. Particularly preferable pressure-sensitive adhesives are ones for optical uses and are normally applied when adhering an optical polymeric function film to a transparent base material such as glass and an acrylic plate; however, usable pressure-sensitive adhesives are not particularly limited as long as they are excellent in weatherproof, transparency, etc.

Usable pressure-sensitive adhesives include acrylic, polyester, silicon and rubber types of pressure-sensitive adhesives. Among these, an acrylic type of pressure-sensitive adhesive is preferably used for good weatherproof properties and transparency.

Such pressure-sensitive adhesives are semi-solid (high viscosity) liquid and exhibit a moderate adhesion force by pressure even at a room temperature; however, the adhesion force can be further improved when they are heated.

In forming a pressure-sensitive adhesive layer, the resin is normally diluted with solvent or it is treated to form emulsions thereof so as to have low viscosity. Then, the resin having low viscosity is applied on the surface of the material to be adhered. Thereafter, the solvent or the water, etc. in the coated layer are evaporated thereby the pressure-sensitive adhesive layer is formed. This method is generally used to form a pressure-sensitive adhesive layer.

When forming a pressure-sensitive adhesive layer in the present invention, the pressure-sensitive adhesive layer is preferably formed on the inner surface (the surface to be adhered) of the polymeric function film in view of the ease in handling. Thus, it can be continuously formed and efficiently processed. It can also be applied onto the surface of the hot melt adhesive film or onto the surface of the frame member. Either case makes it possible to preset the component materials.

The thickness of the pressure-sensitive adhesive layer is not particularly limited; however, a usable the pressure-sensitive adhesives layer preferably has a thickness of about 5–100 $\mu$m because of the fact that it does not degrade the smoothness on the surface of the transparent electromagnetic radiation shielding sheet and the high capability of adhering and forming ease in the film formation. With a thickness of less than the range above, the degree of adhesion force of the adhesive layer may be insufficient. A thickness that is thicker than the range above may degrade the transparency and the smoothness of the surface due to transformation. A more preferable thickness is in the range of 10–50 $\mu$m because an adhesive layer having such thickness has excellent relativity to the hot melt adhesive film and further enhances the smoothness of the surface and the capability of adhering and forming.

When producing a transparent electromagnetic radiation shielding sheet having a polymeric function film laminated therein according to the method of the present invention, a method of integrally laminating component materials having a structure such as the following structures by thermal pressing:

1) (B)/(C)/transparent base material/hot melt adhesive film/(A)/(B)
2) (B)/(C)/transparent base material/(A)/hot melt adhesive film/(B)
3) (B)/transparent base material/(C)/hot melt adhesive film/(A)/(B)
4) (B)/transparent base material/(C)/(A)/hot melt adhesive film/(B)
5) (B)/transparent base material/hot melt adhesive film/(A)/(C)/(B) or
6) (B)/transparent base material/(A)/hot melt adhesive film/(C)/(B), wherein (A) is a mesh-like conductive material having a metal, (B) is a film for forming an antireflection layer, (C) is a film for forming a function layer which transmits selected wavelengths of light; and also an adhesive layer is intervened between each layer of the laminated sheets, if necessary.

Usable thermal pressing methods include high frequency heating, vacuum high frequency heating, electric heating, infrared heating, vacuum heating, etc. or a combination thereof.

Well-known heat-sensitive adhesives or pressure-sensitive adhesives may be used as desired between (B) and (C), (C) and the transparent base material, and (A) and (B) in the structure of 1) above; between (B) and (C), and (C) and the transparent base material in the structure of 2) above; (B) and the transparent base material, the transparent base material and (C), and (A) and (B) in the structure of 3) above; (B) and the transparent base material, the transparent base material and (C), and (C) and (A) in the structure of 4) above; between (B) and the transparent base material, (A) and (C), and (C) and (B) in the structure of 5) above; and between (B) and the transparent base material, and (C) and (B) in the structure of 6) above.

The display device of the present invention has a structure in which the above-described transparent electromagnetic radiation shielding sheet is placed at the front surface of the display panel. Preferred examples of such display device include a plasma display panel, which is a particularly large type of display device, having the transparent electromagnetic radiation shielding sheet placed at the front surface of the plasma display.

The present invention will be explained in further details with embodiments below; however, these embodiments should not limit the scope of the present invention.

EXAMPLE 1

Figure 5:
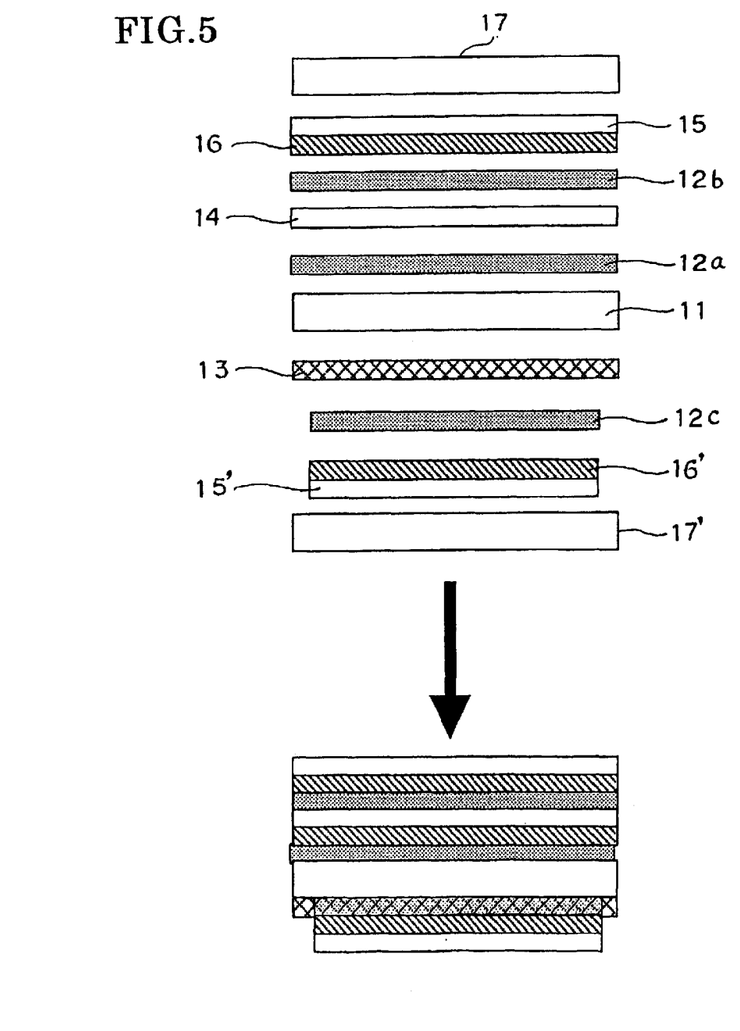
FIG. 5 is a drawing for explaining a method of producing a transparent electromagnetic radiation shielding sheet used in Example 1.

FIG. 5 shows a drawing for describing a method of producing the transparent electromagnetic radiation shielding sheet according to the present invention.

In this example, an antireflection (AR) film 15 having a pressure-sensitive adhesive layer 16 on the inner surface thereof was formed as a polymeric function film so as to be an outer most layer. Also, a hot melt adhesive film 12b adjacent to the pressure-sensitive adhesive layer 16, a near infrared ray (NIR) absorbing film 14 of polymeric function film formed on the inner surface of the hot melt adhesive film and a hot melt adhesive film 12a adjacent to the NIR absorbing film were laminated on a glass plate 11 of the transparent base material.

On the other surface of the glass plate, a conductive fiber mesh 13 formed as a mesh-like conductive material and a hot melt adhesive film 12c with the four peripheral sides, which are corresponding to electrodes to be provided, of the conductive fiber mesh 13 being cut off, were laminated. Then, a frame member was disposed in the cut off portion. An AR film 15' having a pressure-sensitive adhesive layer 16' on the inner surface thereof was also formed so as to be adjacent to the hot melt adhesive film. Thereafter, all of these films were sandwiched between supporting glass plates 17, 17' and were vacuumed in a bag to exhaust the air therein. The films were then integrated by thermal pressing using a thermal pressing device (temperature: 100° C., pressure: 1 MPa, for 60 minutes). Finally, the frame member that corresponds to the portion for electrodes was removed so as to expose the surface of the conductive fiber mesh 13. Thereby, a transparent electromagnetic radiation shielding sheet was obtained. With respect to the adhesion between the glass plate 11 and the conductive fiber mesh 13, the hot melt adhesive film 12c laminated on the outer surface of the conductive fiber mesh 13 was melted by heat so as to permeate into gaps of the conductive fiber mesh thereby firm adhesion was achieved.

Now the materials used herein are explained.

For the AR films 15, 15' and the pressure-sensitive adhesive layers 16, 16' (thickness of 25 $\mu$m), an acrylic AR film having a pressure-sensitive adhesive layer, commercially available as "Realook 8201UV" (product of NOF Corporation), was used.

For the hot melt adhesive film 12a, 12b and 12c, "Acryift WH202" (product of Sumitomo Chemical Co., Ltd., softening temperature: 85° C.) which is a thermal adhesive film of ethylene-(meth)acrylic acid ester was used.

For the NIR absorbing film 14, a film having a near infrared ray absorbing layer coated on a PET film, "A4300" (product of Toyobo Co., Ltd., thickness: 100 $\mu$m) which was used as a base film. The near infrared ray absorbing layer used in this film was provided by dispersing "IRG-022" (product of Nihon Kayaku Co., Ltd.), "NKX-1199" (product of Hayashibara Biochemical Laboratories, Inc.) and "MIR-101" (product of Midori Kagaku Co., Ltd.) which were used as near infrared ray absorbing coloring agents and "kaya-sorb violet AR" (product of Nihon Kayaku Co., Ltd.) and "kaya-sorb blue N" (product of Nihon Kayaku Co., Ltd.) which were used as color adjusting coloring agents in a polycarbonate resin, "L-1250Z" (product of Teijin Chemicals Co., Ltd.).

For the glass plate 11, a double-strength glass "TP3PAEBO" (product of Central Glass Co., Ltd., thickness: 3 mm, 860×650 mm) treated by black bake printing (printed thickness: 30 $\mu$m) so as to have a width in millimeters of black bake print on each peripheral side (all of the four sides) was used.

For the mesh-like conductive fiber mesh 13 used for a mesh-like conductive material, "PU-4X-13530" (product of Seiren Co., Ltd., mesh size: 135×135 mesh, diameter of fiber: 32 $\mu$m) was used.

Figure 6:
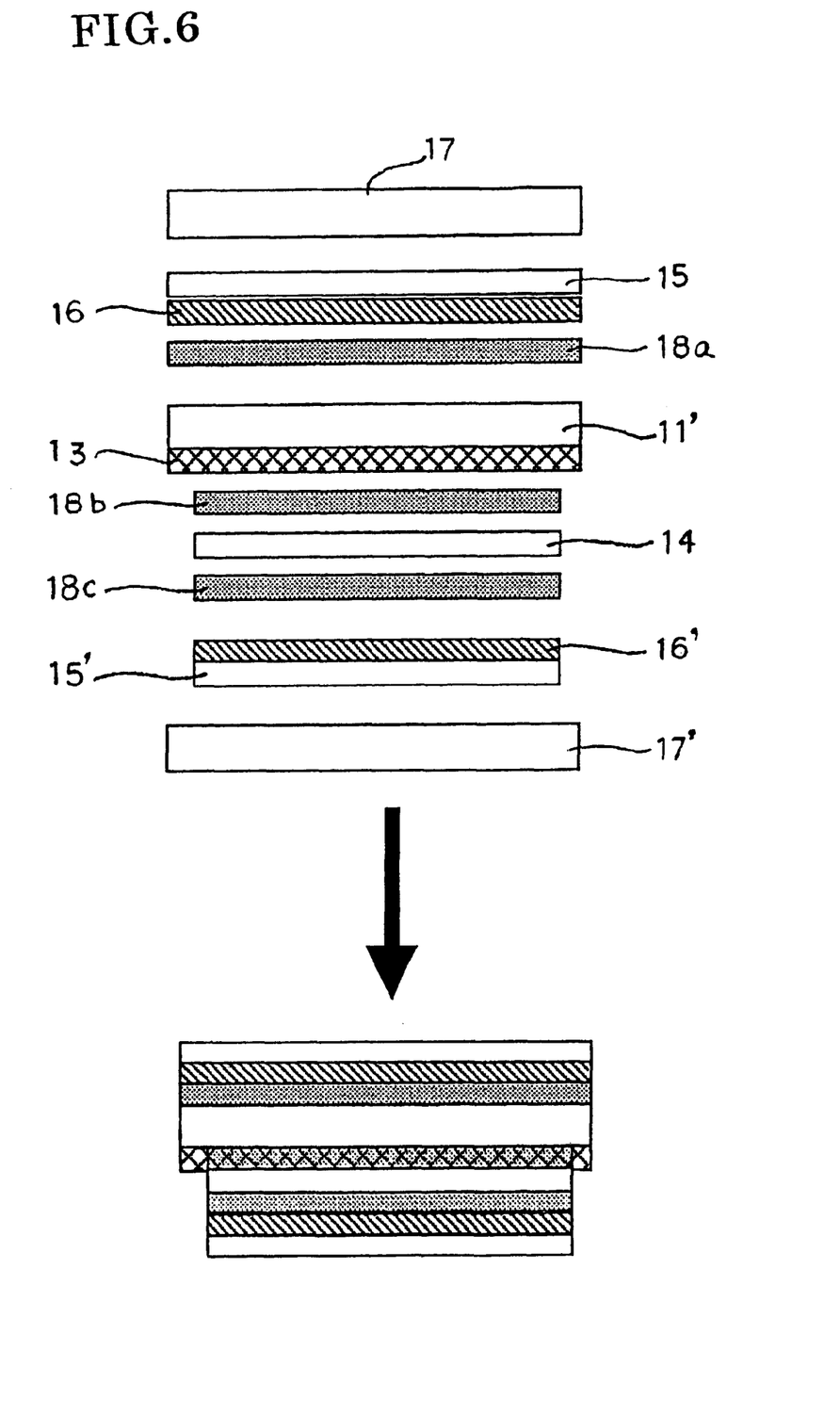
FIG. 6 is a drawing for explaining a method of producing a transparent electromagnetic radiation shielding sheet used in Example 2.

FIG. 6 shows a drawing for describing another embodiment of the method of producing transparent electromagnetic radiation shielding sheet according to the present invention.

For the mesh-like conductive material, a glass plate 11' having a conductive mesh pattern which was directly formed on a glass substrate by patterning. This glass plate 11' was obtained as follows: A dry film resist layer was laminated on the entire surface of a double-strength glass "TP3PAEBO" (product of Central Glass Co., Ltd., thickness: 3 mm, 860×650 mm) which was treated by black bake printing so as to have a black bake print (thickness: 30 μm) having a width in millimeters on each peripheral portion (all of the four sides). Then, the glass plate having the dry film resist layer was exposed and developed using a photo mask having the same pattern as that of a conductive mesh-like patterned material (line width: 20 μm and line pitch: 300 μm) so as to form a resist layer having a pattern opposite to that of the conductive mesh-like patterned material. Thereafter, copper oxide (20 nm, transparent), copper (500 nm) and copper oxide (100 nm, black) were laminated in the order on the entire surface of the obtained glass plate by sputtering so as to form a metallic thin layer and a black layer. Then, the resist layer as well as the metallic layer and the black layer formed thereon were removed using 4 weight % of sodium hydroxide aqueous solution which was used as peeling liquid. Finally, the obtained glass plate was washed with purified water thereby a desired glass 11' having a conductive mesh-like pattern was obtained.

For the hot melt adhesive film 18a, 18b and 18c, "Petrothene 207" (product of Tosoh Corporation, softening temperature: 5° C.) which is an adhesive film of polyethylene having low density was used.

With respect to other materials, the same materials and the same methods of forming the materials as those used in Example 1 were used to obtain a transparent electromagnetic radiation shielding sheet.

Comparative Example 1

Figure 7:
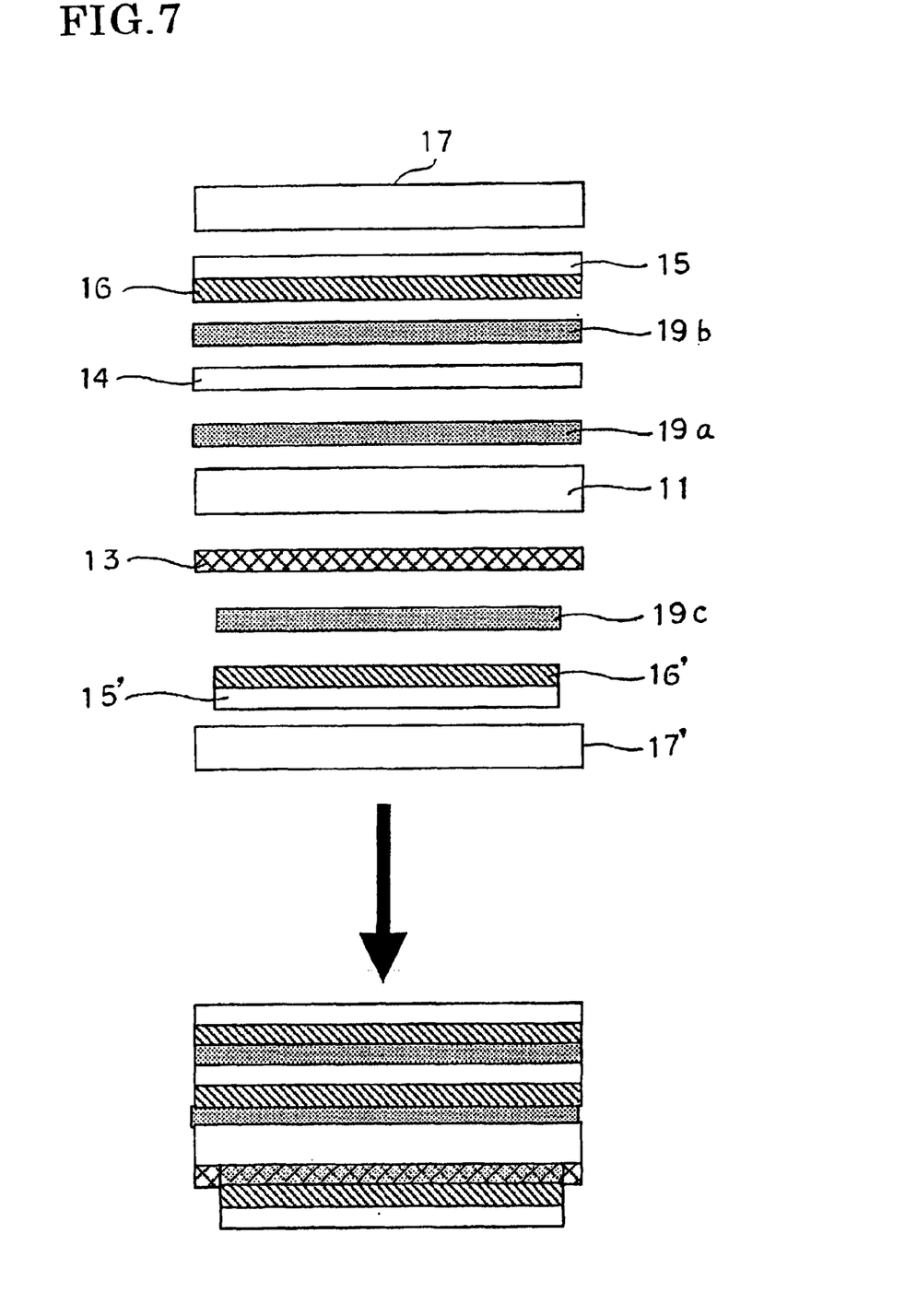
FIG. 7 is a drawing for explaining a method of producing a transparent electromagnetic radiation shielding sheet used in Comparative Example 1.

FIG. 7 shows a drawing for describing an embodiment of the method of producing a transparent electromagnetic radiation shielding sheet according to this comparative example.

In Comparative Example 1, the same materials and the same methods of forming the material as those used in Example 1 were used to obtain a transparent electromagnetic radiation shielding sheet except that "MeltheneG7053" (product of Tosoh Corporation) which is a thermal adhesive film of ethylene-vinylacetate copolymer (EVA), was used for the hot melt adhesive film 19a, 19b and 19c.

Comparative Example 2

Figure 8:
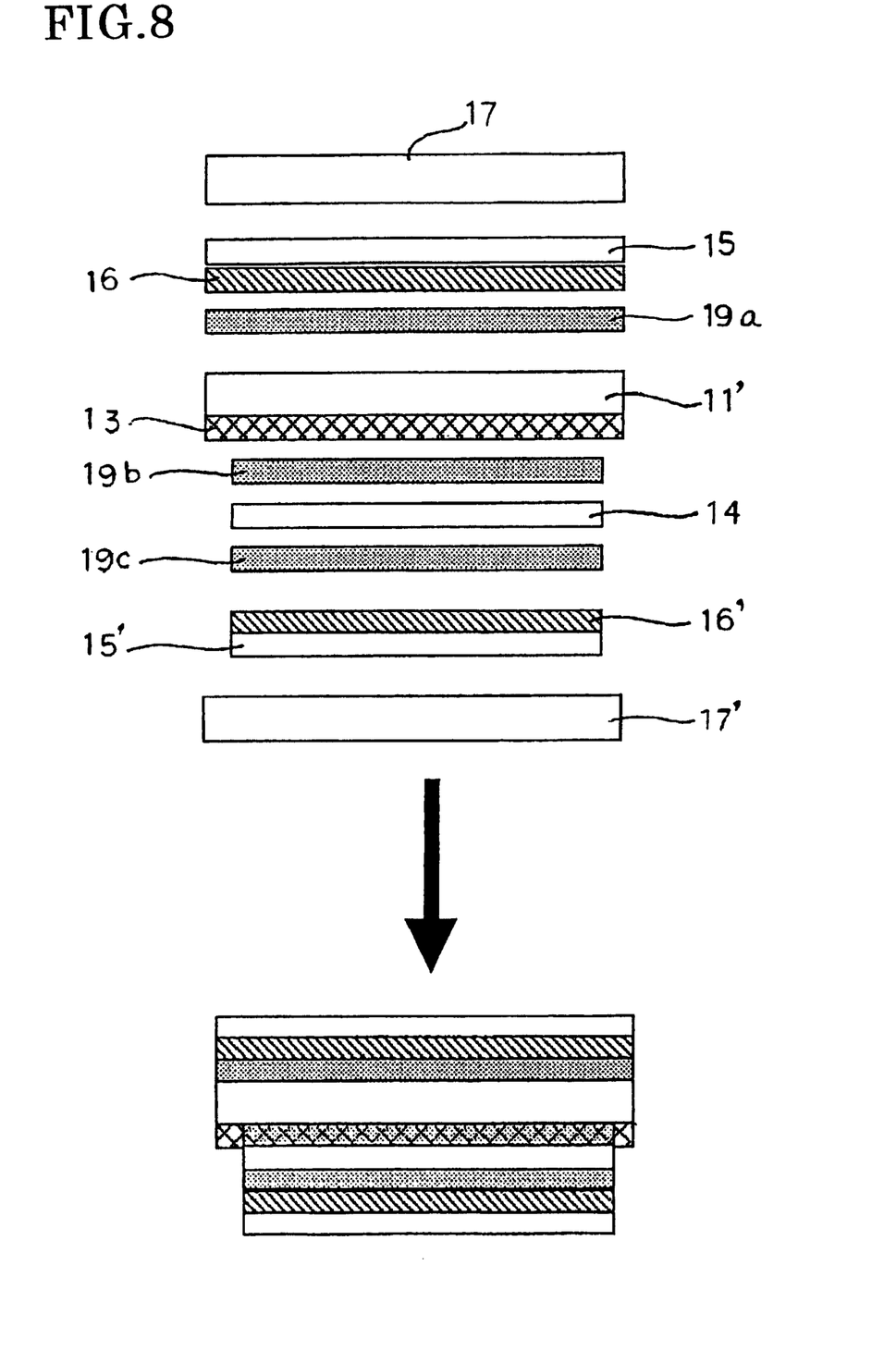
FIG. 8 is a drawing for explaining a method of producing a transparent electromagnetic radiation shielding sheet used in Comparative Example 2.

FIG. 8 shows a drawing for describing another embodiment of a method of producing a transparent electromagnetic radiation shielding sheet according to this comparative example.

In Comparative Example 2, the same materials and the same methods of forming the material as those used in Example 2 were used to obtain a transparent electromagnetic radiation shielding sheet except that "MelsenG7053" (product of Tosoh Corporation) which is a thermal adhesive film of ethylene-vinylacetate copolymer (EVA) was used for the hot melt adhesive film 19a, 19b and 19c.

Small samples (150 mm square for evaluating the electromagnetic radiation shielding performance, 50 mm square for evaluating the transmittance of all lights and the hue) were prepared by the same methods as those used in Examples 1 and 2 as well as Comparative Examples 1 and 2. The various performances of each sample before and after a weathering test were observed and compared. The results are shown in Table 1.

TABLE 1

| Examples Comparative Examples | Shielding Performance (500 MHz) | | Transmittance of All Light | | |
|---|---|---|---|---|---|
| | Before test (dB) | After test (dB) | Before test (%) | After test (%) | Change in Hue |
| Example 1 | 54.0 | 53.5 | 57.0 | 55.6 | ○ |
| Example 2 | 42.6 | 42.4 | 58.0 | 56.9 | ○ |
| Comparative Example 1 | 54.0 | 53.1 | 56.3 | 51.1 | X |
| Comparative Example 2 | 42.6 | 42.1 | 56.7 | 54.0 | Δ |

As seen in Table 1, when using a thermal adhesive film of EVA as used in Comparative Examples 1 and 2, the metal (copper) was ionized and melted out with acetic acid which was produced by hydrolysis during the weathering test, causing a change in hue (exhibiting a greenish hue) and degrading the transparency. On the other hand, when using hot melt heat adhesive film as used in Examples 1 and 2, no change in hue was observed and thus the transparency was not degraded. These results demonstrated that transparent electromagnetic radiation shielding sheets obtained in Examples 1 and 2 had excellent shielding performance, transparency, adhesion force, etc.

The present invention provides the following advantageous effects:

In the transparent electromagnetic radiation shielding sheet of the present invention, a hot melt adhesive resin does not produce organic acid by hydrolysis so that a mesh-like conductive material does not corrode even when used under conditions of high temperature and high moisture. Thus, it exhibits excellent visible light transmittance and adhesion force.

The transparent electromagnetic radiation shielding sheet has sufficient visible light transmittance and electromagnetic radiation shielding performance. Further, it is light and has excellent durability and thereby it is preferably used in various display devices.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A transparent electromagnetic radiation shielding sheet comprising:
    a transparent base material,
    a mesh-like conductive material having a metal, and
    a resin layer contacting at least one surface of said mesh-like conductive material, said resin layer comprising a hot melt adhesive resin having 80 weight % of at least one of the repetition units represented by the following generic formulae (I), (II) and (III):

(I)

(wherein $R^1$ represents a hydrogen atom or a methyl group)

$$-(-CH_2-C(R^2)(COO-R^3)-)- \quad (II)$$

(wherein $R^2$ represents a hydrogen atom or a methyl group, and $R^3$ represents an alkyl group having from 1 to 4 carbon atoms)

(III)

(wherein $R^4$ represents a hydrogen atom or an alkyl group having from 1 to 4 carbon atoms).

2. A transparent electromagnetic radiation shielding sheet as defined in claim 1, wherein said hot melt adhesive resin has a softening temperature of 70–120° C.

3. A transparent electromagnetic radiation shielding sheet as defined in claim 2, wherein said mesh-like conductive material having a metal includes a copper foil.

4. A transparent electromagnetic radiation shielding sheet as defined in claim 3, further comprising at least one of the films selected the group consisting of a film that forms an antireflection layer and a film that forms a function layer which transmits a selected wavelength of light, the films being laminated on at least one surface of said transparent base material.

5. A transparent electromagnetic radiation shielding sheet as defined in claim 2, wherein said mesh-like conductive material having a metal includes a copper pattern formed on said transparent base material.

6. A transparent electromagnetic radiation shielding sheet as defined in claim 2, further comprising at least one of the films selected the group consisting of a film that forms an antireflection layer and a film that forms a function layer which transmits a selected wavelength of light, the films being laminated on at least one surface of said transparent base material.

7. A transparent electromagnetic radiation shielding sheet as defined in claim 1, wherein said mesh-like conductive material having a metal includes a copper foil.

8. A transparent electromagnetic radiation shielding sheet as defined in claim 7, further comprising at least one of the films selected the group consisting of a film that forms an antireflection layer and a film that forms a function layer which transmits a selected wavelength of light, the films being laminated on at least one surface of said transparent base material.

9. A transparent electromagnetic radiation shielding sheet as defined in claim 1, wherein said mesh-like conductive material having a metal includes a copper pattern formed on said transparent base material.

10. A transparent electromagnetic radiation shielding sheet as defined in claim 1, further comprising at least one of the films selected the group consisting of a film that forms an antireflection layer and a film that forms a function layer which transmits a selected wavelength of light, the films being laminated on at least one surface of said transparent base material.

11. A method of producing a transparent electromagnetic radiation shielding sheet comprising the steps of:

forming a mesh-like conductive material having a metal on a transparent base material;

laminating a hot melt adhesive film having 80 weight % of at least one of the repetition units represented by the following generic formulae (I), (II) and (III):

$$-(-CH_2-CH(R^1)-)- \quad (I)$$

(wherein $R^1$ represents a hydrogen atom or a methyl group)

$$-(-CH_2-C(R^2)(COO-R^3)-)- \quad (II)$$

(wherein $R^2$ represents a hydrogen atom or a methyl group, and $R^3$ represents an alkyl group having from 1 to 4 carbon atoms)

(III)

(wherein $R^4$ represents a hydrogen atom or an alkyl group having from 1 to 4 carbon atoms) on said mesh-like conductive material; and conducting thermal pressing so as to melt the hot melt adhesive film and to integrally laminate the component materials.

12. A method of producing a transparent electromagnetic radiation shielding sheet as defined in claim 11, further comprising providing at least one of the laminated sheets having the following structures formed by thermal pressing to integrally laminate the component materials:

(B)/(C)/transparent base material/hot melt adhesive film/(A)/(B) (B)/(C)/transparent base material/(A)/hot melt adhesive film/(B) (B)/transparent base material/(C)/hot melt adhesive film/(A)/(B) (B)/transparent base material/(C)/(A)/hot melt adhesive film/(B) (B)/transparent base material/hot melt adhesive film/(A)/(C)/(B) or (B)/transparent base material/(A)/hot melt adhesive film/(C)/(B), wherein (A) is a mesh-like conductive material having a metal, (B) is a film that forms an anti-reflection layer, (C) is a film that forms a function layer which selectively transmits a wavelength of light, and providing an adhesive layer intervened between at least one layer of the laminated sheets.

13. A display device having a transparent electromagnetic radiation shielding sheet disposed on a front surface of said display device, said transparent electromagnetic radiation shielding sheet comprising:

a transparent base material, a mesh-like conductive material having a metal, and a resin layer contacting at least one surface of said mesh-like conductive material, said resin layer comprising a hot melt adhesive resin having 80 weight % of at least one of the repetition units represented by the following generic formulae (I), (II) and (III):

$$-(-CH_2-CH(R^1)-)-\quad (I)$$

($R^1$ represents a hydrogen atom or a methyl group)

$$-(-CH_2-C(R^2)(COO-R^3)-)-\quad (II)$$

($R^2$ represents a hydrogen atom or a methyl group, and $R^3$ represents an alkyl group having from 1 to 4 carbon atoms)

($R^4$ represents a hydrogen atom or an alkyl group having from 1 to 4 carbon atoms).

14. A display device as defined in claim 13, wherein said hot melt adhesive resin has a softening temperature of 70–120° C.

15. A display device as defined in claim 13, wherein said mesh-like conductive material having a metal includes a copper foil.

16. A display device as defined in claim 13, wherein said mesh-like conductive material having a metal includes a copper pattern formed on said transparent base material.

17. A display device as defined in claim 13, further comprising at least one of the films selected the group consisting of a film that forms an antireflection layer and a film that forms a function layer which transmits a selected wavelength of light, the films being laminated on at least one surface of said transparent base material.

* * * * *